(12) United States Patent
Kools et al.

(10) Patent No.: US 7,405,085 B2
(45) Date of Patent: Jul. 29, 2008

(54) AMORPHOUS SOFT MAGNETIC SHIELDING AND KEEPER FOR MRAM DEVICES

(75) Inventors: Jacques Constant Stefan Kools, Sunnyvale, CA (US); Ming Mao, Pleasanton, CA (US); Thomas Schneider, Pleasanton, CA (US); Jinsong Wang, Pleasanton, CA (US); Michael Gutkin, Danville, CA (US)

(73) Assignee: Veeco Instruments, Inc., Woodbury, NY (US)

( * ) Notice: Subject to any disclaimer, the term of this patent is extended or adjusted under 35 U.S.C. 154(b) by 127 days.

(21) Appl. No.: 10/943,510

(22) Filed: Sep. 15, 2004

(65) Prior Publication Data

US 2005/0045998 A1 Mar. 3, 2005

(51) Int. Cl.
*H01L 21/00* (2006.01)

(52) U.S. Cl. ........................................... 438/3; 257/422
(58) Field of Classification Search .................. 438/3; 257/422

See application file for complete search history.

(56) References Cited

U.S. PATENT DOCUMENTS 4,972,285 A * 11/1990 Otomo et al. ............... 360/120
6,413,788 B1 * 7/2002 Tuttle ............................ 438/3

* cited by examiner

*Primary Examiner*—Douglas M Menz
(74) *Attorney, Agent, or Firm*—DLA Piper US LLP

(57) ABSTRACT

An amorphous soft magnetic thin film material for forming shielding and keeper applications in MRAM devices. The amorphous soft magnetic material may be deposited using Physical Vapor Deposition (PVD) in the presence of a magnetic field, in order to form shielding layers and keepers in a multi-layer metallization process. The soft magnetic material may be an amorphous metallic alloy, such as CoZrX, where X may be Ta, Nb, Pd and/or Rh.

8 Claims, 7 Drawing Sheets

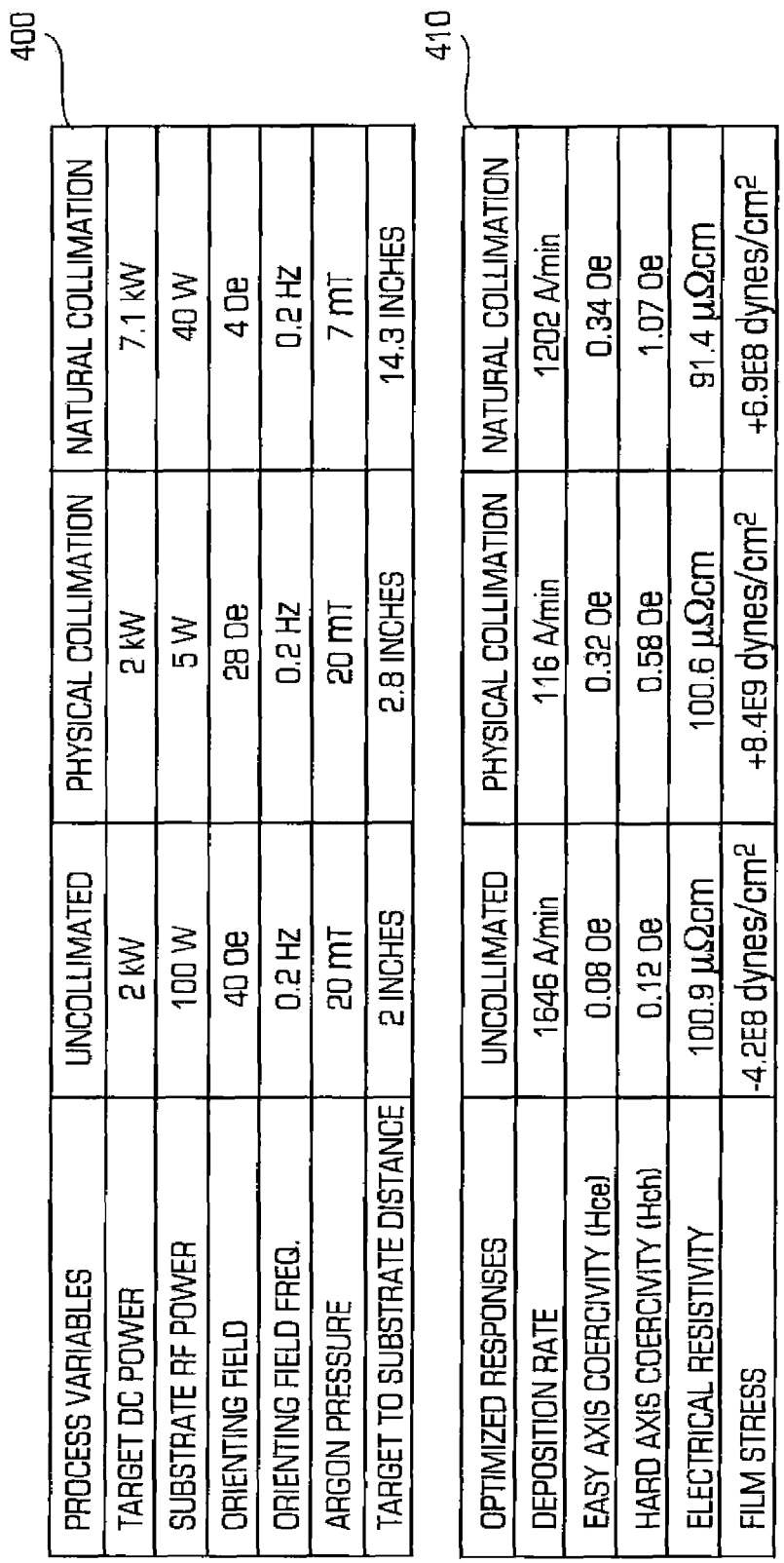

| PROCESS VARIABLES | UNCOLLIMATED | PHYSICAL COLLIMATION | NATURAL COLLIMATION |
|---|---|---|---|
| TARGET DC POWER | 2 kW | 2 kW | 7.1 kW |
| SUBSTRATE RF POWER | 100 W | 5 W | 40 W |
| ORIENTING FIELD | 40 Oe | 28 Oe | 4 Oe |
| ORIENTING FIELD FREQ. | 0.2 Hz | 0.2 Hz | 0.2 Hz |
| ARGON PRESSURE | 20 mT | 20 mT | 7 mT |
| TARGET TO SUBSTRATE DISTANCE | 2 INCHES | 2.8 INCHES | 14.3 INCHES |

| OPTIMIZED RESPONSES | UNCOLLIMATED | PHYSICAL COLLIMATION | NATURAL COLLIMATION |
|---|---|---|---|
| DEPOSITION RATE | 1646 A/min | 116 A/min | 1202 A/min |
| EASY AXIS COERCIVITY (Hce) | 0.08 Oe | 0.32 Oe | 0.34 Oe |
| HARD AXIS COERCIVITY (Hch) | 0.12 Oe | 0.58 Oe | 1.07 Oe |
| ELECTRICAL RESISTIVITY | 100.9 μΩcm | 100.6 μΩcm | 91.4 μΩcm |
| FILM STRESS | -4.2E8 dynes/cm$^2$ | +8.4E9 dynes/cm$^2$ | +6.9E8 dynes/cm$^2$ |

FIG. 4

| PARAMETER | VALUE |
|---|---|
| TARGET COMPOSITION | $Co_{91.5}Zr_4Ta_{4.5}$ |
| POWER | 3500 W |
| PRESSURE | 5 mTorr |
| CHUCK HEIGHT | 1.3 INCH |
| MAGNET CURRENT | 5 A |
| DEP RATE | 36 Å/s |
| UNIFORMITY | <0.7 % 1 σ ON 4 INCH WAFER <br> <1.2 % 1 σ ON 6 INCH WAFER <br> <1.6 % 1 σ ON 8 INCH WAFER |
| REPEATABILITY | 0.35 % 1 σ |

AMORPHOUS SOFT MAGNETIC SHIELDING AND KEEPER FOR MRAM DEVICES

FIELD OF THE INVENTION

The present invention generally relates to magnetic random access memory (MRAM) devices and more particularly, to an amorphous soft magnetic layer for application as a shield and keeper in MRAM devices.

BACKGROUND OF THE INVENTION

Magnetic Random Access Memory (MRAM) devices based on spin-dependent tunnel junctions are being explored as non-volatile solid state memory devices for embedded and stand alone applications. MRAM devices utilize magnetic material within memory cells to store data bits. The data bits are read by magnetoresistive sensing. MRAM memory cells can be programmed by magnetizing the magnetic material within the cells. The magnetic field required to switch the state of a cell (e.g., from "0" to "1") is typically quite low, e.g., in the range of 10-25 Oersteds (Oe).

In its basic concept, an MRAM memory cell typically consists of a patterned magnetic multi-layer bit region, and two conductive lines (e.g., the word and bit lines) that are used to read and write the magnetic state of the multi-layer bit region. In further refinements, additional magnetic layers have been included within MRAM memory cells in order to (1) provide magnetic shielding and (2) improve write efficiency.

1. Magnetic Shielding

In order to successfully incorporate MRAM into portable electronic devices such as portable phones, personal digital assistants (PDA's), pagers, and the like, it is necessary to shield the MRAM devices from stray magnetic fields that may present within and around such devices. Examples of such disturbances include the magnetic field generated by a loudspeaker in a telephone, which may be as large as approximately 800 Oe, and the current in the overhead lines of a train, which may produce magnetic fields as large as approximately 50 Oe.

Efforts have been made to shield MRAM devices from these types of stray magnetic fields. For example, U.S. Pat. No. 5,902,690 of Tracy et al. ("Tracy et al.") describes the introduction of a passivation layer encapsulating the chip. Tracy et al. describes two embodiments of a passivation layer. The first embodiment uses a ceramic material that includes ferrite particles to encapsulate the MRAM cell. The second embodiment uses a ferrite film, which is deposited on top of the MRAM device. U.S. Pat. No. 6,211,090 of Durlam et al. ("Durlam et al.") describes another method of shielding an MRAM device, namely by forming a metallic, high permeability shielding layer, such as NiFe, on top of the completed device.

2) Improving Write Efficiency by Use of a Magnetic Keeper

Inserting a soft magnetic keeper around the write conductors of an MRAM device has been found to provide a desirable modification or concentration of the flux path resulting in an increase of the write efficiency, which could result in a decreased power consumption of the device. U.S. Pat. No. 5,956,267 of Hurst et al. discloses such an arrangement.

An important aspect of magnetic shielding and keeper layers is their compatibility with standard integrated circuit (IC) metallization processing. A state of the art metallization scheme typically encompasses the use of multilevel copper metallization layers, separated by dielectric layers such as Plasma Enhanced Chemical Vapor Deposited (PECVD) $SiO_2$ or other low k materials (e.g., in a dual damascene metallization scheme). For a magnetic layer to be integrated in such a process flow, the following criteria are desirable:

1. The permeability $\mu$ of the magnetic film should be sufficiently high (e.g., >100). The efficiency of shielding is proportional to the film thickness "t" multiplied by $\mu$. Having an insufficient value of $\mu$ results in an unpractical requirement on the thickness of the magnetic shielding layer.
2. The thermal stability of the magnetic material must be such that the permeability is not reduced significantly by the thermal budget associated with the process. The thermal budget of a damascene process is typically governed by the dielectric deposition. One example of a typical temperature for such a process may be 450° C.
3. The preparation method of the magnetic film should preferably employ standard semiconductor deposition methods such as Physical Vapor Deposition (PVD) or Chemical Vapor Deposition (CVD).
4. The magnetic material should preferably not contain metals which, when diffusing in the silicon, would degrade transistor performance. If such materials are used, the use of a diffusion barrier is required.
5. In the case of the keeper layer, the permeability has to have a high value at frequencies close to and slightly above the write frequency of the memory (e.g., several hundreds of MHz to low GHz).

While above-referenced prior art teachings provide shielding and keepers for use with MRAM devices, they suffer from some drawbacks resulting from the materials that are used, which make them difficult to incorporate into a multi-layer IC metallization process.

For example, while the inventions of Tracy et al. and Durlam et al. are effective to shield MRAM devices from stray magnetic fields, they suffer from some drawbacks resulting from the types of materials used for the shielding and passivation layers. For example, the foregoing references propose using either oxidic magnetic films (e.g., Mn—Zn-Ferrite or Ni—Zn-Ferrite) or crystalline metallic films (e.g., NiFe alloys) for shielding. Crystalline materials (e.g., $Ni_{80}Fe_{20}$, $Ni_{45}Fe_{55}$, FeTaN) generally display some degree of recrystallization during high temperature processes which leads to a degradation of magnetic properties. Therefore, these materials may be unsuited for multi-layer IC fabrications in which a device undergoes one or more high temperature processes after the deposition of a shielding or passivation layer.

In Hurst et al., NiFe, CoNiFe and CoFe are suggested as materials for keeper fabrication. One drawback associated with the materials used for the keeper of Hurst et al. is that they require the use of a diffusion barrier such as TiW, TaN, or the like. The inclusion of this additional diffusion layer undesirably complicates and increases the cost of the fabrication process. Furthermore, it has been found that the permeability of such materials drops typically in the frequency range of tens to hundreds of MHz, due to eddy current losses and ferromagnetic resonance. This adversely affects the operation and effectiveness of the keeper layers at frequencies relatively close to the write frequency of typical MRAM devices (e.g., several hundreds of MHz to low GHz).

There is therefore a need for a new and improved material for magnetic shielding and keeper applications in MRAM devices, which is adapted for integration with a multi-layer fabrication process.

SUMMARY OF THE INVENTION

Generally, the present invention provides a soft magnetic material with improved properties for use in both shield and keeper applications in MRAM devices.

One non-limiting advantage of the invention is that it uses films of amorphous soft magnetic alloys, such as CoZrTa, for magnetic shielding and keeper applications. These amorphous soft magnetic alloys have several unique advantages to allow for integration with a dual damascene Copper/SiO$_2$ (or low-k) metallization process. Some non-limiting examples include:

(i) excellent thermal stability (e.g., crystallization temperature >450° C.), making this material compatible with standard CMOS backend processing;

(ii) significant permeability up to the write frequencies required in high speed memory devices (several GHz); and (iii) for the case of CoZrTa, the possibility to eliminate the barrier layer.

Another non-limiting advantage of the present invention is that it provides a soft magnetic shielding layer that may be introduced between subsequent layers of a multilevel metallization. This allows for the transport of large currents through metallization layers located on one side of the magnetic layer, without affecting the magnetic state of MRAM cells located on the other side of the magnetic layer.

Another non-limiting advantage of the present invention is that it provides an amorphous, soft magnetic material that can be interposed between different layers of spin-dependent tunnel junctions.

According to a first aspect of the present invention, a keeper is provided for an MRAM device including a bit region and a current carrying line which magnetically interacts with the bit region. The keeper comprises an amorphous soft magnetic material which is disposed generally around the current carrying line.

According to a second aspect of the present invention, a shielding structure is provided for an MRAM device having a bit region and a current carrying line which magnetically interacts with the bit region. The shielding structure includes an amorphous soft magnetic material which is disposed adjacent to the MRAM device and which is effective to block external magnetic fields from affecting the bit region of the MRAM device.

According to a third aspect of the present invention, a method of fabricating a keeper for an MRAM device having a bit region and a current carrying line is provided. The method includes the steps of: providing an amorphous soft magnetic material; and forming the keeper from the amorphous soft magnetic material.

According to a fourth aspect of the present invention, a method of fabricating a shielding structure for an MRAM device is provided. The method includes the steps of: providing an amorphous soft magnetic material; and forming the shielding structure from the amorphous soft magnetic material.

According to a fifth aspect of the present invention, a method of fabricating an MRAM device is provided. The method includes the steps of: providing a substrate; depositing a dielectric layer on the substrate; forming a trench in the dielectric layer for forming a first current carrying line; depositing an amorphous soft magnetic material in the trench; depositing a conductor into the trench, thereby forming the first current carrying line, wherein the amorphous soft magnetic material forms a first keeper around the first current carrying line; forming a bit region over the current carrying line; forming a second current carrying line above the bit region; and depositing an amorphous soft magnetic material above the second current carrying line, thereby forming a second keeper around the second current carrying line.

These and other features, advantages, and objects of the invention will become apparent by reference to the following specification and by reference to the following drawings.

BRIEF DESCRIPTION OF THE DRAWINGS

FIG. 4 depicts a pair of tables showing exemplary process variables that may be used in a PVD tool to deposit an amorphous soft magnetic alloy, according to one embodiment of the present invention, and optimized responses for the deposition process.

DETAILED DESCRIPTION OF THE EMBODIMENTS

The present invention will now be described in detail with reference to the drawings, which are provided as illustrative examples of the invention so as to enable those skilled in the art to practice the invention. The preferred embodiment of the soft magnetic shield and keeper and the method for forming the same are described in relation to a multi-layer MRAM fabrication procedure. However, it will be appreciated by those skilled in the art that the present invention is equally applicable to other types of fabrication procedures.

Generally, soft magnetic thin film materials can be classified in three main classes including: (1) crystalline metallic films such as Permalloy (NiFe alloys around the composition Ni$_{80}$Fe$_{20}$), FeXN (where X may be a metal such as Ta, Al, Ti, etc.), and the like; (2) Oxidic metallic films such as Manganese Zinc Ferrite or Nickel Zinc Ferrite; and (3) amorphous metallic films such as CoNbZr, CoTaZr or CoPdZr. While prior art MRAM fabrication procedures have included the use of class (1) and (2) materials for shielding and keeper applications, none of the prior art have contemplated the use of class (3) materials.

The present invention provides MRAM devices that utilize amorphous, soft magnetic thin film materials (e.g., class (3) materials) for shielding and keeper applications, and a process for forming such devices. In the preferred embodiment, the family of amorphous metallic alloys of the form CoZrX, where X may be Nb, Ta, Pd and/or Rh for example, are used for integrated magnetic shielding and keeper layers in an MRAM device fabrication procedure.

Figure 1A:
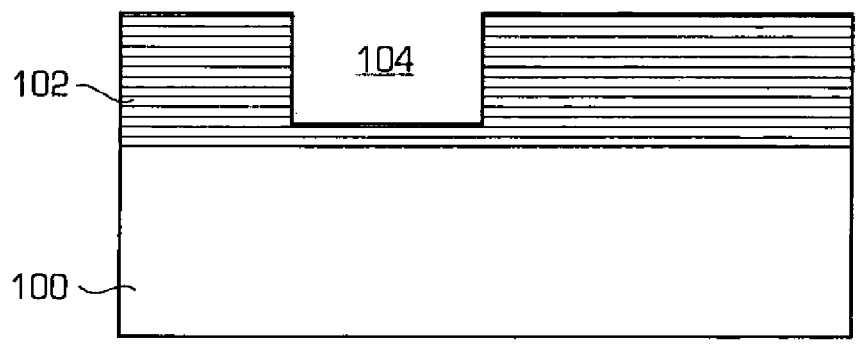
FIGS. 1A-1H depict an exemplary process flow for fabricating an MRAM device having keepers, according to the present invention.

FIGS. 1A-1H depict an exemplary embodiment of a process flow, which may be utilized for fabricating an MRAM apparatus, according to the present invention. FIG. 1A depicts a side sectional view of a conventional substrate 100, and a dielectric (e.g., SiO$_2$ or other low k material) layer 102, which is deposited on top of substrate 100 in a conventional manner.

In the first step of the process flow, a word or bit line trench 104 is formed (e.g., etched) into the dielectric layer 102 in a known manner.

Figure 1B:
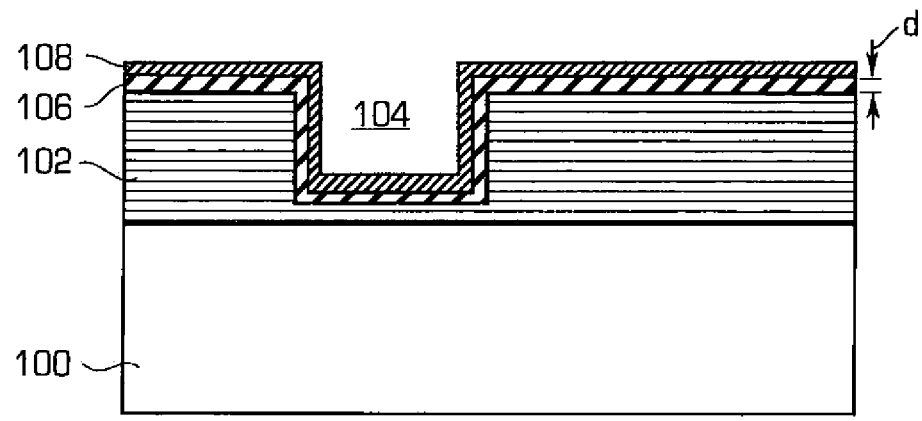

FIG. 1B illustrates a second step in the process flow. In this second step, a keeper layer 106 is deposited on top of the dielectric layer 102. The keeper layer 106 is formed from an amorphous, soft magnetic material. Particularly, in the preferred embodiment, the keeper layer 106 is formed from an amorphous metallic alloy, such as CoZrX, where X may be Ta, Nb, Pd and/or Rh. Any suitable ratios of Co, Zr, Ta, Nb, Pd, and Rh may be used in the alloy, and those skilled in the art will appreciate how to select ratios for certain alloys to provide the amorphous and soft magnetic properties, and to ensure that the material best suits a particular application. For example, in one embodiment, the Co concentration should be in the range of approximately 80-90% to ensure a high saturation magnetization. Furthermore, the proportions of the elements may be adjusted to achieve a desired the magnetostriction constant $\lambda$ of the material. One of ordinary skill in the art will appreciate how to make such adjustments. For example, K. Hayashi et al., *J Appl. Phys.*, Vol. 61, p. 2983 (1987) teach a variety of compositions in the ternary phase diagram, suitable for this application. The particular composition can be chosen based on specific requirements for crystallization temperature and saturation magnetization.

In one embodiment, the aspect ratio of the sidewall coverage in the trench 104 may be in the range of approximately 1:0.5 to 1:2. For example, in one embodiment, the thickness of the keeper 106 on the bottom of the trench 104 may be approximately 100 Å, and the thickness on the side of the trench may be approximately 50 Å. In the preferred embodiment, the thickness "d" of the keeper 106 may be in the range of 50 to 500 Å.

In one embodiment the keeper layer 106 may be formed or deposited by use of a Physical Vapor Deposition (PVD) or sputtering process, which may be performed in a conventional PVD cluster tool in the presence of a magnetic field. Other techniques that may be used include Ion Beam Deposition (IBD), evaporation, ionized PVD (I-PVD), ion-metal plasma (IMP), Cathodic Arc deposition, atomic layer deposition (ALD), Chemical Vapor Deposition (CVD) or Electroplating. However, PVD is preferred since it is well-established that PVD allows to deposit films with the appropriate magnetic properties. The application of a magnetic field during deposition leads to better-defined soft magnetic properties. Some examples of process variables that may be used in a PVD tool (with no collimation, physical collimation and natural collimation) to deposit a particular amorphous soft magnetic alloy (i.e., CoZrNb) are illustrated in table 400 of FIG. 4, and optimized responses for the process are shown in table 410 of FIG. 4.

In the step illustrated in FIG. 1B, a lining layer 108 may also be deposited on top of the keeper layer 106. In one embodiment, the lining layer 108 may comprise TaN. In other embodiments, the lining layer 108 may be deposited first (e.g., on top of the dielectric layer 102), followed by the keeper layer 106 (e.g., on top of the lining layer 108). The lining layer 108 may serve as a diffusion barrier and adhesion layer.

Figure 1C:
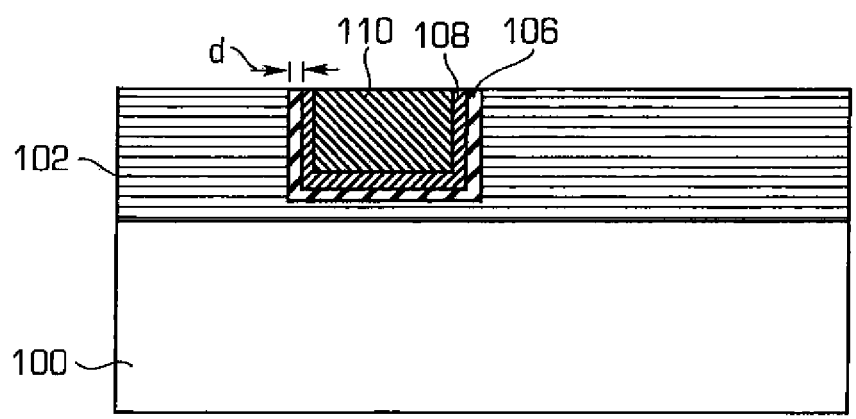

In the next step of the process flow, illustrated in FIG. 1C, a conductive material (e.g., Cu or Al) is deposited within the trench 104, thereby forming a current carrying line 110 (e.g., a word or bit line). In the preferred embodiment, the current carrying line 110 is formed by depositing conductive material over the entire surface of the device by use of a conventional electroplating process. Next, a chemical mechanical polish is performed over the surface of the device, effective to remove excess portions of the conductive material, keeper, and liner, thereby forming the structure shown in FIG. 1C. As shown in FIG. 1C, keeper 106 is formed or disposed generally around current carrying line 110 (e.g., in relative close proximity and/or adjacent to the bottom and side walls of the current carrying line 110). In other embodiments, keeper 106 may have a different shape, and in one example, keeper 106 may be adjacent only to the bottom of line 110.

Figure 1D:
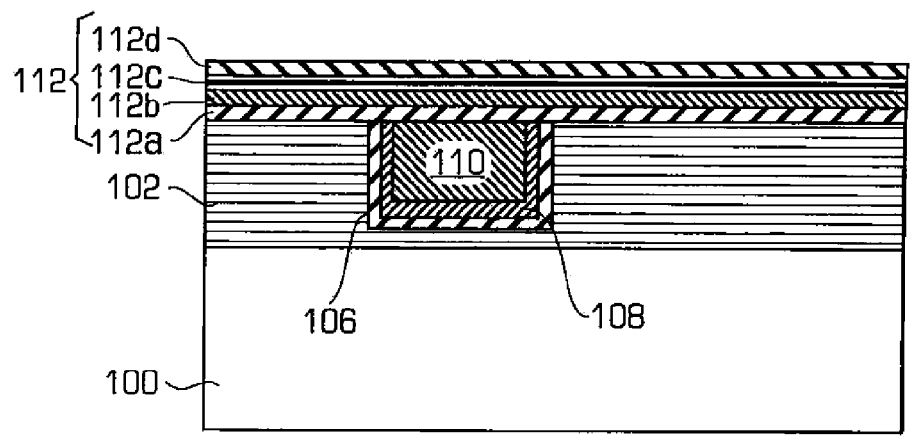
Figure 1E:
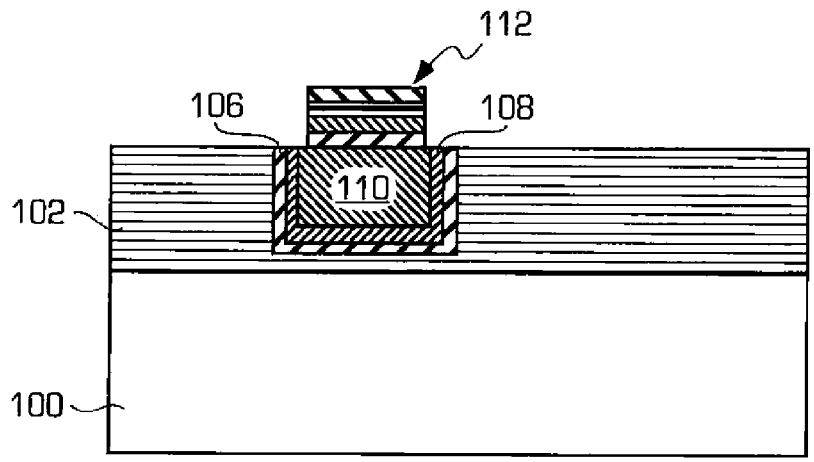

In the next step of the process flow, illustrated in FIG. 1D, a tunnel-magneto-resistance (TMR) stack 112 is deposited across the surface of the device in a conventional manner. The TMR stack may include a plurality of layers 112a-112d. In one embodiment, layer 112a may be an anti-ferromagnetic layer (e.g., 200 Å IrMn); layer 112b may be a "pinned" layer (e.g., 25 Å CoFe/8 Å Ru/20 Å CoFe); layer 112c may be a tunnel barrier (e.g., 15 Å $Al_2O_3$), and layer 112d may be a "free" layer (e.g., 10 Å CoFe/30 Å NiFe). Portions of the TMR stack 112 are then removed (e.g., etched) in a conventional manner (e.g., using an Ion Beam Etch (IBE)), effective to form the structure shown in FIG. 1E, wherein the remaining portion of the TMR stack 112 forms the bit region of an MRAM memory cell.

Figure 1F:
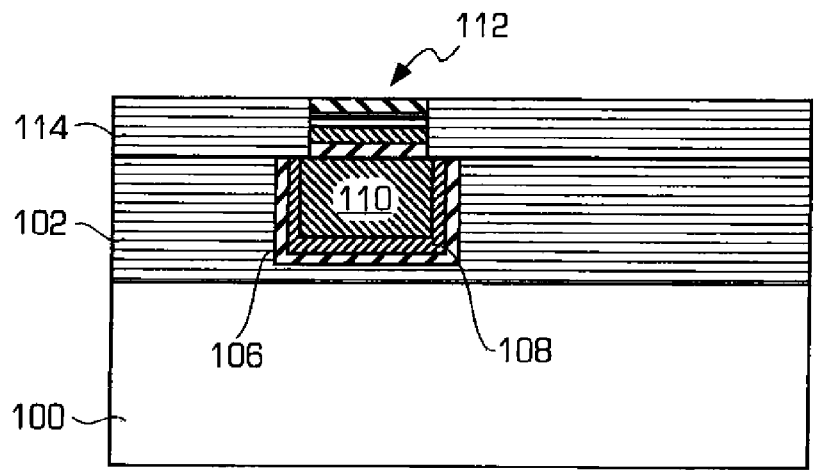

In the next step of the process flow, illustrated in FIG. 1F, an encapsulation layer 114, which may comprise a dielectric material (e.g., $SiO_2$), is deposited over the entire surface of the device in a conventional manner. After the layer 114 is deposited, a chemical mechanical polish may be performed to provide the resulting structure illustrated in FIG. 1F.

Figure 1G:
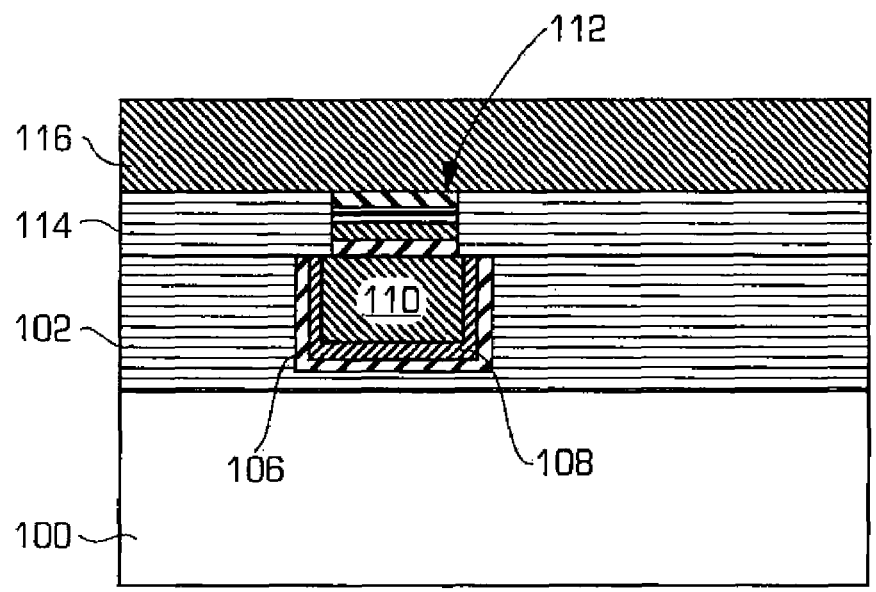

In the next step of the process flow, illustrated in FIG. 1G, a conductive material (e.g., Cu or Al) is deposited over the surface of the device, and is subsequently etched, to form a current carrying line 116 (e.g., a word or bit line), which is disposed in a substantially perpendicular relationship with line 110. Line 116 is formed over bit region 112, which is located between line 110 and line 116. Line 116 may have generally the same shape as line 110 (e.g., line 116 may have a rectangular cross section).

Figure 1H:
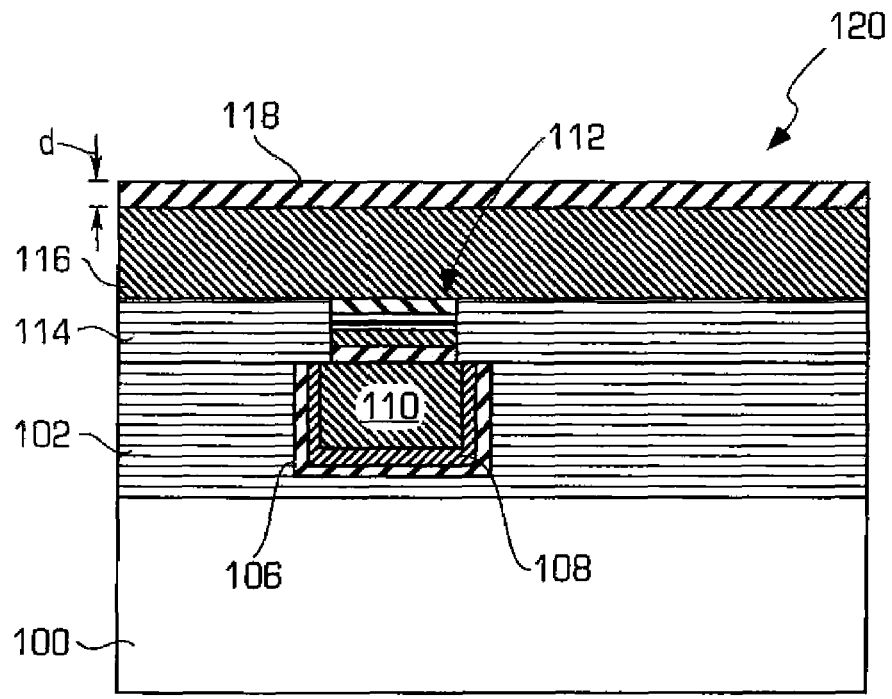

In the next step of the process flow, illustrated in FIG. 1H, a top keeper layer 118 is deposited on top of the conductor 116, thereby forming MRAM device 120. The keeper layer 118 is formed from an amorphous, soft magnetic material, which may be substantially identical to the material that forms keeper layer 106. Particularly, in the preferred embodiment, the keeper layer 118 may be formed from an amorphous metallic alloy, such as CoZrX, where X may be Ta, Nb, Pd and/or Rh. The keeper layer 118 may also be formed by use of a PVD tool, in a process substantially similar to the process used to form keeper 106, including the application of a magnetic field during deposition. Keeper 118 is formed or disposed generally around current carrying line 116 (e.g., in relative close proximity to and/or adjacent to the top and side walls of the current carrying line 116). In other embodiments, keeper 118 may have a different shape, and in one example, keeper 118 may be adjacent only to the bottom of line 116. In the preferred embodiment, the thickness "d" of the keeper 118 may be in the range of 50 to 500 Å.

It should be appreciated that while a single MRAM device 120 is illustrated in FIGS. 1A-1H, the foregoing process may be used to create multiple MRAM devices 120.

The use of amorphous soft magnetic alloys in the forgoing fabrication process provides significant advantages over prior materials and processes. Particularly, the amorphous soft magnetic alloys have several unique advantages that support integration in a multi-layer (e.g., dual damascene Copper/$SiO_2$ or low-k) metallization process, including: (i) excellent thermal stability (e.g., crystallization temperature >450° C.), making the materials compatible with standard CMOS backend processing; (ii) significant permeability up to the write frequencies required in high speed memory devices (several GHz); and (iii) for some amorphous soft magnetic allows, such as CoZrTa, the possibility to eliminate or reduce the diffusion barrier layer.

Figure 2:
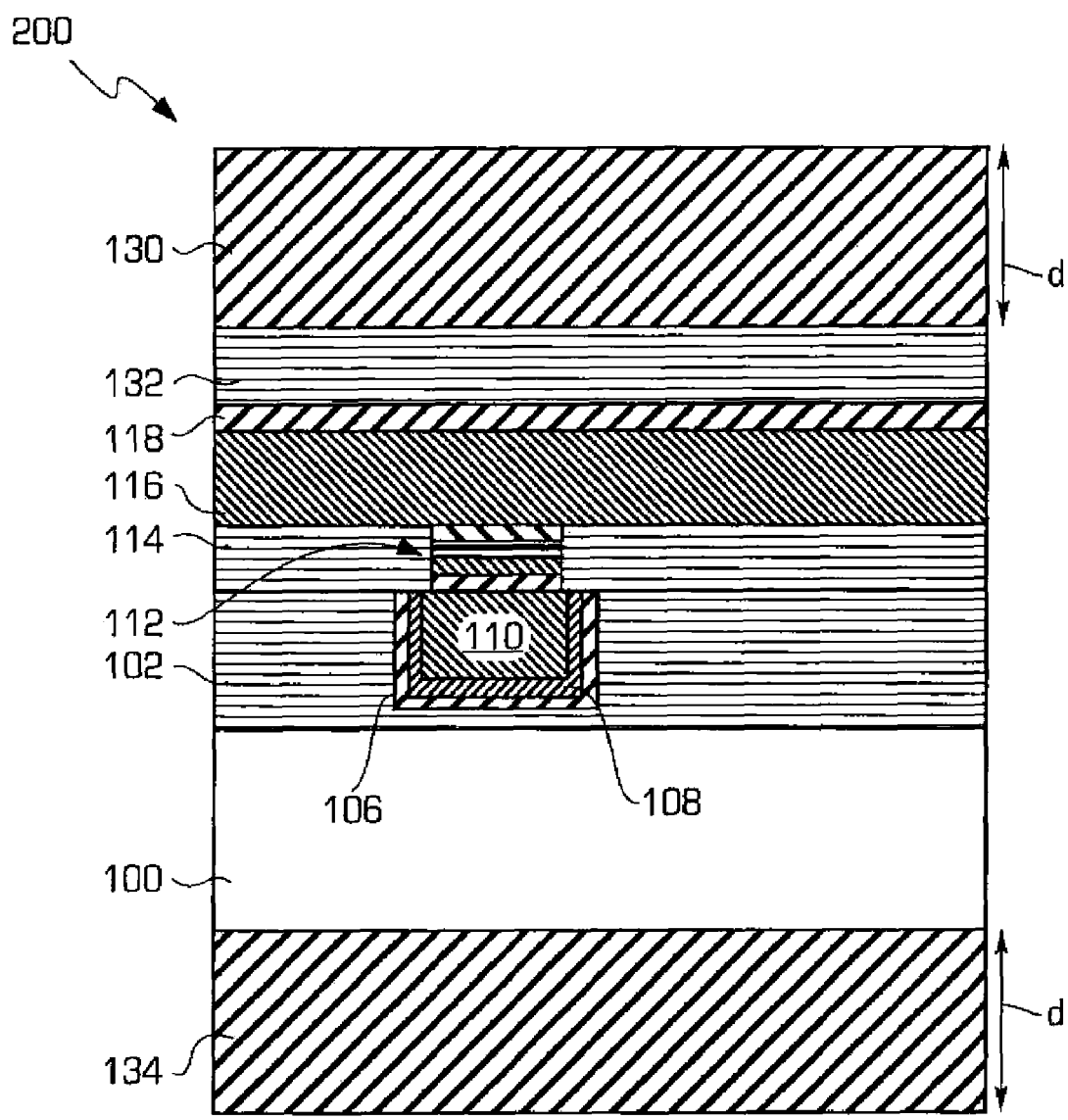
FIG. 2 is side sectional view of an MRAM device including layers for shielding against external magnetic fields.

In one embodiment of the present invention, one or more shielding layers may be formed around the MRAM device to provide shielding from external fields. FIG. 2 illustrates one non-limiting embodiment of an MRAM device 200 including top and bottom shielding layers 130, 134, respectively, which are formed from amorphous soft magnetic materials. As shown in FIG. 2, shielding layers 130, 134 are disposed in relative close proximity to and/or adjacent to the top and bottom of the MRAM device 200. Particularly, shielding layer 130 is disposed above current carrying line 116, and shielding layer 134 is disposed below current carrying line 116. MRAM device 200 includes many of the same elements as MRAM device 120, as indicated by those elements having identical reference numerals. MRAM device 200 may be formed by continuing the process flow from FIG. 1H, and depositing the top and bottom shielding layers on device 120 in any order. In the preferred embodiment, a dielectric layer 132 (e.g., $SiO_2$) is deposited on top of keeper 118, and the top shielding layer 130 is deposited on top of dielectric layer 132. The bottom shielding layer 134 may be deposited directly below substrate 100.

The shielding layers 130, 134 may be formed by use of a Physical Vapor Deposition (PVD) or sputtering process, which may be performed in a conventional PVD cluster tool in the presence of a magnetic field. In the preferred embodiment, the thickness "d" of the shielding layers may be in the range of 0.1 µm to 10 µm. In one embodiment, the thickness "d" of the shielding layers is approximately 1 µm. One example of process conditions that may be used in a known PVD tool to deposit a particular amorphous soft magnetic alloy (i.e., $Co_{91.5}Zr_4Ta_{4.5}$) are illustrated in table 500 of FIG. 5.

The amorphous soft magnetic shielding layers 130, 134 will prevent stray flux from reaching and/or affecting the bit region 112 of the MRAM cell.

Figure 3:
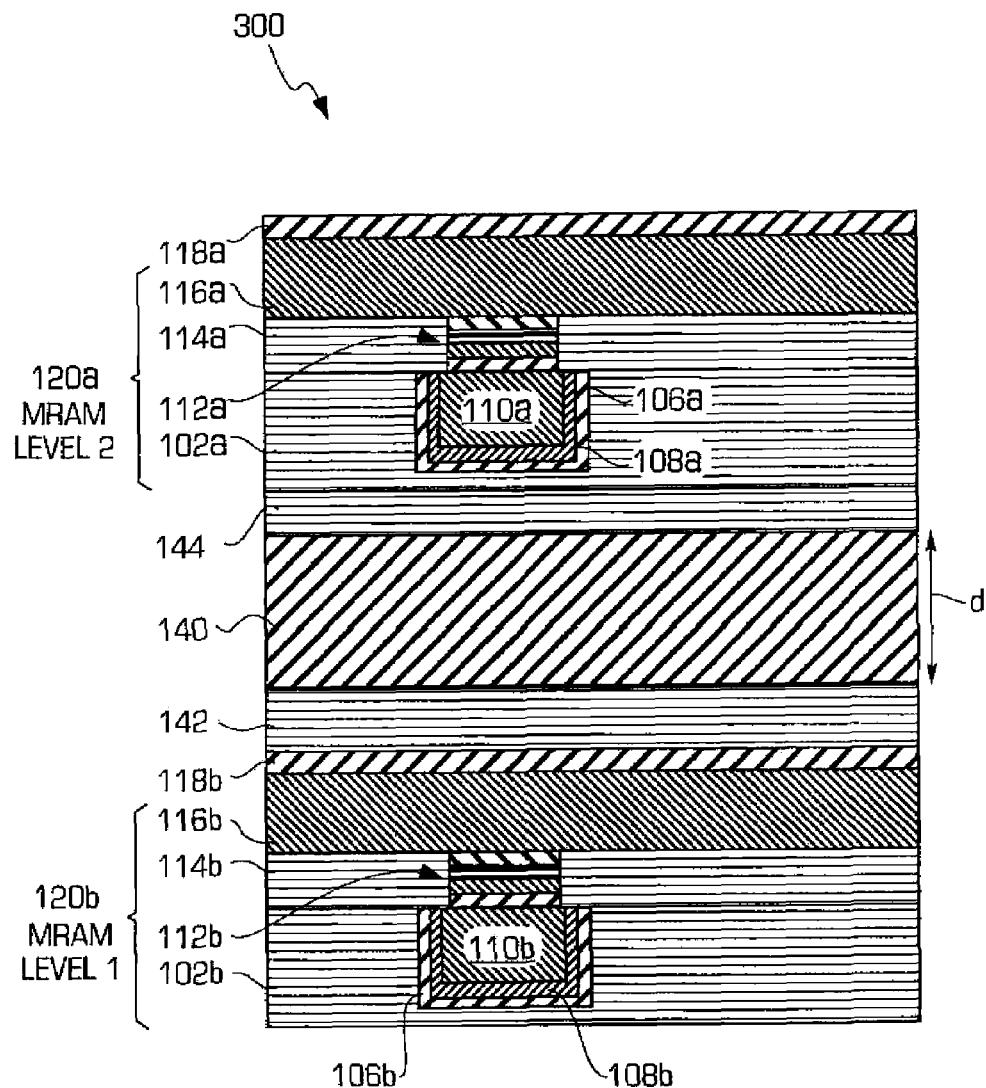
FIG. 3 is a side sectional view of an MRAM device including shielding between memory cells on different levels.

In another embodiment of the present invention, one or more shielding layers may be formed between MRAM cells at different levels of a multilevel MRAM device. FIG. 3 illustrates one non-limiting embodiment of a multilevel MRAM device 300 including a top level 120a and a bottom level 120b, which are separated by a shielding layer 140, which is formed from an amorphous soft magnetic material. MRAM device 300 includes many of the same elements as MRAM device 120, as indicated by those elements having identical reference numerals with the addition of an "a" or "b" character to differentiate between top level device 120a and bottom level device 120b. MRAM devices 120a, 120b may be formed in a substantially similar manner as MRAM device 120. In the preferred embodiment, bottom level device 120b is formed first. After the bottom level device 120b is formed, a dielectric layer 142 (e.g., $SiO_2$) is deposited on top of keeper 118b. The shielding layer 140 is deposited on top of dielectric layer 142.

The shielding layer 140 may be formed by use of a Physical Vapor Deposition (PVD) or sputtering process, which may be performed in a conventional PVD cluster tool in the presence of a magnetic field. In the preferred embodiment, the thickness of the shielding layer 140 may be in the range of 0.1 µm to 10 µm. In one embodiment, the thickness "d" of the shielding layer 140 is approximately 1 µm. The process conditions that may be used in a PVD tool to deposit the shielding layer 140 may be substantially identical to those used to deposit shielding layers 130, 134.

After shielding layer 140 is formed, a dielectric layer 144 (e.g., $SiO_2$) may be deposited on top of layer 140. Top level device 120a may then be formed on top of dielectric layer 144. The soft magnetic shielding layer(s) 140 will substantially prevent all magnetic fields generated during the writing of one level from affecting the state of the other level(s), thereby avoiding erroneous reading and writing.

It has been shown that amorphous soft magnetic films, such as CoZrTa films, deposited by conventional Physical Vapor Deposition (PVD) could be integrated in a standard multi-level metallization flow, without loss of permeability. For example, CoZrTa films have been found to have a high permeability (e.g., µ~1000) up to the GHz frequency range. Since the typical write pulses of an MRAM cell is on the order of 2 ns, this type of soft magnetic layer will act as such for this kind of pulse width.

Figures 5, 6:
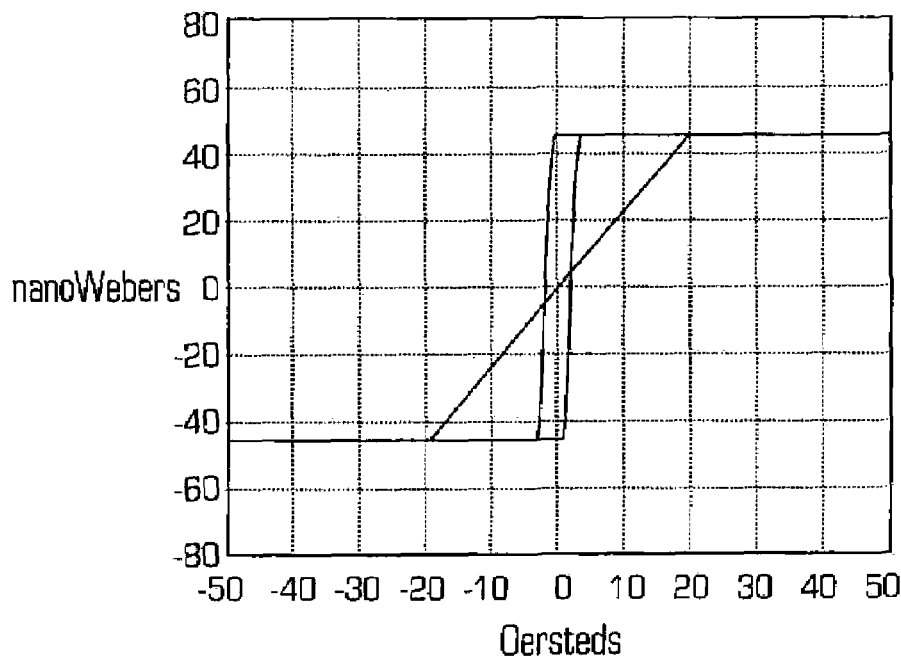
FIG. 5 is a table illustrating exemplary process conditions that may be used to deposit a keeper layer of amorphous soft magnetic material in an MRAM fabrication process, according to one embodiment of the invention.
FIG. 6 is a magnetization loop for a 2000 Å CoZrTa film.

It has further been found that such films can be made by conventional DC-magnetron Physical Vapor Deposition (PVD) in the presence of an external magnetic field. For example, from a $Co_{91.5}Zr_{4.5}$ target at 3500 W power density, 5 mTorr of Ar pressure and 5 Amperes of current in the electromagnet gave a deposition rate of 36 Å/s, sufficient for industrial application in a high throughput manufacturing environment. These films are found to be amorphous and display excellent soft magnetic properties, as illustrated by the magnetization loop of FIG. 6. Particularly, FIG. 6 illustrates a magnetization loop for a 2000 Å CoZrTa film.

Hence, the use of amorphous soft magnetic materials for shielding and keeper applications in MRAM devices provides significant advantages over class (1) and class (2) materials. For example, the amorphous soft magnetic materials display a much higher crystallization temperature and are thus better suited for a multi-layer MRAM fabrication process. The amorphous soft magnetic materials also have significant permeability up to the write frequencies required in high speed memory devices (several GHz). Moreover, some amorphous soft magnetic alloys, such as CoZrTa, allow for the elimination or reduction of a diffusion barrier layer.

It should be understood that the inventions described herein are provided by way of example only and that numerous changes, alterations, modifications, and substitutions may be made without departing from the spirit and scope of the inventions as delineated within the following claims.

What is claimed is:

1. A method of fabricating a keeper for an MRAM device having a bit region and a current carrying line, the method comprising the steps of:
    providing an amorphous soft magnetic material via a deposition process performed in association with a current carrying line created in an MRAM fabrication process; and
    forming the amorphous soft magnetic material generally about the current carrying line to create one or more keeper regions of the amorphous soft magnetic material disposed in relative close proximity and/or adjacent to the current carrying line.

2. The method of claim 1 wherein the amorphous soft magnetic material is an amorphous metallic alloy of the form CoZrX, where X is selected from the group consisting of Ta, Nb, Pd and Rh.

3. The method of claim 1 wherein the step of forming the keeper includes the following steps:
    providing a substrate;
    depositing a dielectric layer on the substrate;

forming a trench in the dielectric layer for forming a current carrying line;

depositing the amorphous soft magnetic material in the trench; and depositing a conductor into the trench, thereby forming the current carrying line, wherein the amorphous soft magnetic material forms a keeper around the current carrying line.

4. The method of claim 3 wherein the amorphous soft magnetic material is deposited in the presence of an external magnetic field.

5. The method of claim 3 wherein the amorphous soft magnetic material is deposited by use of a PVD process.

6. The method of claim 1 wherein the step of forming the keeper includes the following steps:

forming the bit region from a TMR stack;

encapsulating the bit region with a dielectric material;

forming a current carrying line over the bit region; and depositing the amorphous soft magnetic material over the current carrying line, thereby forming a keeper around the current carrying line.

7. The method of claim 6 wherein the amorphous soft magnetic material is deposited in the presence of an external magnetic field.

8. The method of claim 6 wherein the amorphous soft magnetic material is deposited by use of a PVD process.

* * * * *